United States Patent [19]
Shirai

[11] Patent Number: 4,873,448
[45] Date of Patent: Oct. 10, 1989

[54] INPUT CIRCUIT HAVING A PHOTO-COUPLER WITH BI-DIRECTIONAL INDICATOR

[75] Inventor: Hironobu Shirai, Takatsuki, Japan

[73] Assignee: Omron Tateisi Electronics Co., Kyoto, Japan

[21] Appl. No.: 42,736

[22] Filed: Apr. 27, 1987

[30] Foreign Application Priority Data

Apr. 30, 1986 [JP] Japan .................................. 61-65266

[51] Int. Cl.[4] .............................................. G02B 27/00
[52] U.S. Cl. ..................................... 250/551; 307/311
[58] Field of Search ........................ 250/551; 307/311; 357/19

[56] References Cited

U.S. PATENT DOCUMENTS

| 4,041,331 | 8/1977 | Westerman et al. | 307/311 |
| 4,063,121 | 12/1977 | Bartlett | 307/311 |
| 4,143,287 | 3/1979 | Biggs | 307/311 |
| 4,612,670 | 9/1986 | Henderson | 250/551 |
| 4,628,303 | 12/1986 | Boyle | 307/311 |
| 4,636,655 | 1/1987 | Nagano | 307/311 |
| 4,658,145 | 4/1987 | Awaji | 250/551 |

Primary Examiner—David C. Nelms
Attorney, Agent, or Firm—Stevens, Davis, Miller & Mosher

[57] ABSTRACT

Disclosed is an input circuit using a photo-coupler for circuit isolation which comprises a photo-coupler and an indicator for indicating the presence of an input signal both of which are adapted for an AC input signal as well as a DC input signal of either polarity. Typically, the input end of the photo-coupler comprises a pair of light emitting diodes which are connected in parallel with each other directionally opposite and the indicator comprises a pair of light emitting diode chips which are connected in a similar manner. Thereby, the input circuit can be adapted to input signals of all kinds and the indication of the presence of an input signal is accurate because the indicator is directly driven by the input signal and is not affected by the condition of any external circuit.

10 Claims, 6 Drawing Sheets

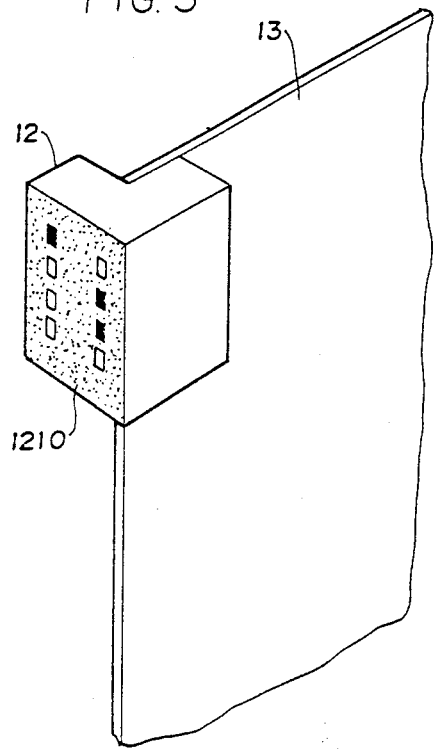
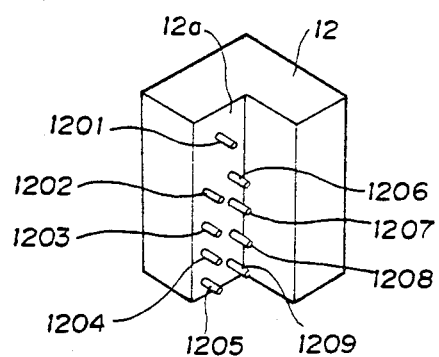

INPUT CIRCUIT HAVING A PHOTO-COUPLER WITH BI-DIRECTIONAL INDICATOR

TECHNICAL FIELD

This invention relates to an input circuit using a photo-coupler for isolation between the input end of the input circuit and an internal circuit which is connected to the output end of the input circuit and in particular to an input circuit which is suitable for use as an input unit of a programmable controller.

BACKGROUND OF THE INVENTION

Typically, an input unit of a programmable controller comprises input circuits incorporating photo-couplers of the same number as its input points. The photo-couplers are used for isolating the internal circuit of the programmable controller from the influence of input signals. FIG. 7 shows a typical input circuit using a photo-coupler 3 for isolation. This circuit comprises input terminals TO and COM, a diode bridge 1 having input nodes which are connected to the input terminals TO and COM, a light emitting diode 2 and a photo-coupler 3. The photo-coupler 3 comprises a light emitting diode 3a serving as the input end thereof and a photo-transistor 3b disposed adjacent to the light emitting diode 3a and serving as the output end thereof. The two light emitting diodes 2 and 3a are connected in series across the output nodes of the diode bridge 1.

According to this circuit, the input signal supplied across terminals TO and COM is rectified by the diode bridge 1 and the rectified output of the diode bridge 1 is supplied to an internal circuit by way of the uni-directional photo-coupler 3 for isolation while the presence of the input signal is displayed to the outside by the light emitting diode 2 which is connected in series with the other light emitting diode 3a serving as the input end of the photo-coupler 3. By use of the diode bridge 1, the input signal of this input circuit may be a DC signal of either polarity or even an AC signal, and not only the signal is transferred across the photo-coupler 3 but also the presence of the input signal is indicated by the light emitting diode 2 irrespective of the nature of the input signal.

However, according to this circuit, since the diode bridge 1 is relatively expensive and occupies a substantial area on the circuit board, the cost of the input circuit tends to be high and the size of the input circuit can not be reduced to the desired extent.

FIG. 8 is a circuit diagram of another example of an input circuit which is used in an input unit of a conventional programmable controller. In this circuit, the input signal applied across terminals TO and COM is transferred to an internal circuit directly by way of a bi-directional input type photo-coupler 4 having a pair of light emitting diodes 4a and 4b which are connected in parallel to each other but directionally opposite and the presence of the input signal is indicated by a light emitting diode 5 which is connected in series with an output element of the photo-coupler 4 which is a photo-transistor 4c in this case.

According to this circuit, the cost and size reduction of the input unit is possible through elimination of a diode bridge, but since the light emitting diode 5 receives electric power from the internal circuit, the indication of the presence of an input signal may not be accurate since the function of the light emitting diode 5 is affected by the condition of the internal circuit.

Thus, as shown in FIG. 9, it is conceivable to improve the circuit of FIG. 8 by connecting the light emitting diode 6 in series with the input side of the bi-directional input type photo-coupler 4, but if the input is a DC signal there is a restriction on the polarity [potential] of terminal TO and a negative input is unacceptable.

SUMMARY OF THE INVENTION

In view of such problems of the prior art, a primary object of the present invention is to provide an input circuit using a photo-coupler for circuit isolation which can accept an AC input signal as well as a DC input signal of either polarity and indicate the presence of the input signal irrespective of the nature of the input signal.

Another object of the present invention is to provide an input circuit using a photo-coupler which is both compact and economical to manufacture.

In order to achieve these and other objects, the present invention provides an input circuit for accepting an external input signal by way of a photo-coupler for circuit isolation, comprising: a photo-coupler having an input end consisting of a bi-directional element; and an indicator of a bi-directional type which is connected in series with the input end of the photo-coupler.

According to this structure, since no diode bridge is required the input circuit can be made compact and economical to manufacture, and since the light emitting element is directly driven by the input signal the presence of an input signal can be accurately detected. Furthermore, since the light emitting element is of a bi-directional type there is no restriction on the polarity of the input signal even when it is a DC signal.

According to a certain aspect of the present invention, the indicator of a bi-directional type comprises a pair of light emitting diodes which are connected in parallel to each other but directionally opposite. These light emitting diodes may be either individual diodes which are externally connected to each other or may be formed into an integral single device. In the former case, the pair of light emitting diodes of the indicator are placed adjacent to each other and the indicator further comprises a light dispersing element which covers the light emitting diode pair. According to a preferred embodiment of the present invention, the indicator comprises a plurality of light emitting diode pairs which are mounted over a circuit board, a spacer plate having a plurality of windows corresponding to the positions of the light emitting diode pairs and placed over the circuit board, and a light dispersing film which is placed over the spacer plate.

According to another aspect of the present invention, the input end of the photo-coupler comprises a pair of light emitting diodes which are connected in parallel with each other but directionally opposite.

BRIEF DESCRIPTION OF THE DRAWINGS

FIG. 3 is a perspective view showing a light emitting element module incorporating the input circuits of the present invention and mounted on a circuit board of the input circuit;

FIG. 4 is a perspective view showing the reverse surface of the light emitting element module;

DETAILED DESCRIPTION OF THE PREFERRED EMBODIMENTS

Figure 1:
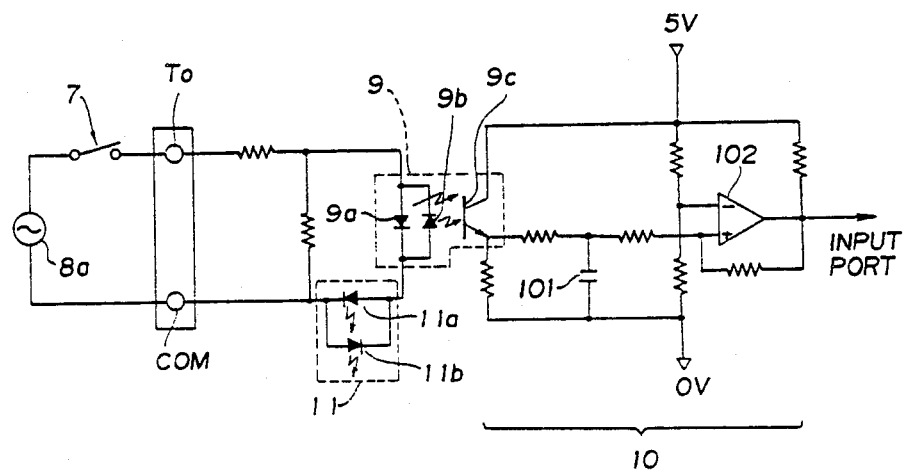
FIG. 1 is a circuit diagram showing the structure of an input circuit for one a plurality of input points of an input unit of a programmable controller to which the present invention is applied.

FIG. 1 is a circuit diagram of one of a number of input circuits of an input unit for a programmable controller to which the present invention is applied.

Input terminals TO and COM of this input circuit are connected to an AC power source 8a and an external contact 7 which may be a sensor consisting of a limit switch. Internally, the input terminals TO and COM are connected to an input end of a photo-coupler 9 and a light emitting diode unit 11 which are connected in series across the input terminals TO and COM. The input end of the photo-coupler 9 comprises a pair of light emitting diodes 9a and 9b which are connected in parallel to each other directionally opposite while the light emitting diode unit 11 likewise comprises a pair of light emitting diodes 11a and 11 which are also connected in parallel to each other but directionally opposite.

The output end of the photo-coupler 9 comprises a transistor 9c which forms a part of an internal circuit or, in the present embodiment, a waveform shaping circuit 10. The waveform circuit 10 comprises a capacitor 101 for suppressing noise and an operational amplifier 102 for converting the output signal of the photo-coupler 9 into a binary signal. Typically, the binary signal is supplied, as required, to a system bus (not shown in the drawings) which is connected to a CPU by way of an input port consisting of a tri-state buffer. Normally, for each input unit, a plurality of such input circuits, for instance, eight, sixteen or thirty-two input circuits are mounted on a single circuit board so as to correspond to the number (eight, sixteen or thirty-two points) of the input points.

Figure 2A:
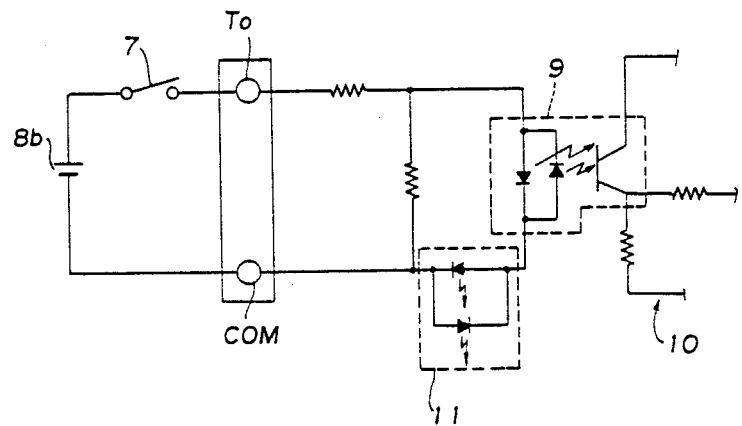
FIGS. 2A and 2B are circuit diagrams similar to FIG. 1 showing the action of an embodiment of the input circuit of the present invention.
Figure 2B:
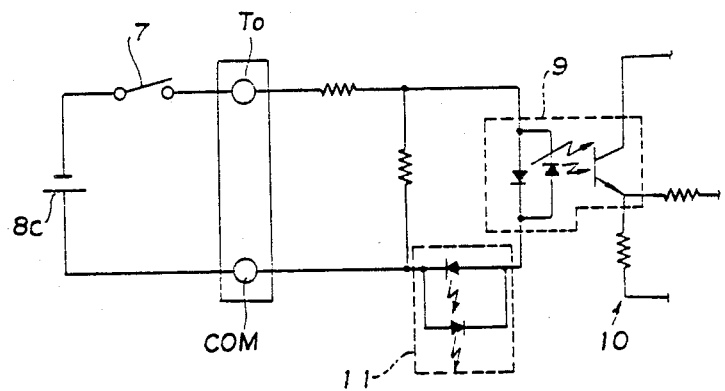

According to this circuit structure, since no diode bridge is required as opposed to conventional input circuits the input circuit can be made compact and economical to manufacture, and since the bi-directional input type light emitting diode unit 11 is directly driven by the input signal the presence of an input signal can be accurately detected without being affected by the state of the internal circuit. Furthermore, since the light emitting diodes 9a and 9b serving as the input end of the photo-coupler 9 can accept a signal of either polarity there is no restriction on the polarity of the input signal source 8b or 8c even when it is a DC signal as shown in FIGS. 2A and 2B whereby the input circuit can be adapted to both positive and negative input signals.

FIG. 3 is a perspective view showing a light emitting element module 12 which incorporates therein eight bi-directional input type light emitting diode pairs 11 and is mounted on an circuit board 13 of the input circuit of a programmable controller having input circuits for eight input points. In this light emitting element module 12, bi-directional input type light emitting diode pairs 11 freight input points are molded in synthetic resin and nine terminal pins 1201 to 1209 corresponding to nine input terminals (COM and T0 to T7) of the input circuit protrude from the rear face 12a thereof as shown in FIG. 4. The light emitting element module 12 is mounted on the circuit board 13 of the input circuit with these terminal pins 1201 to 1209 passed through pin holes provided in the circuit board and soldered thereto.

Figure 5:
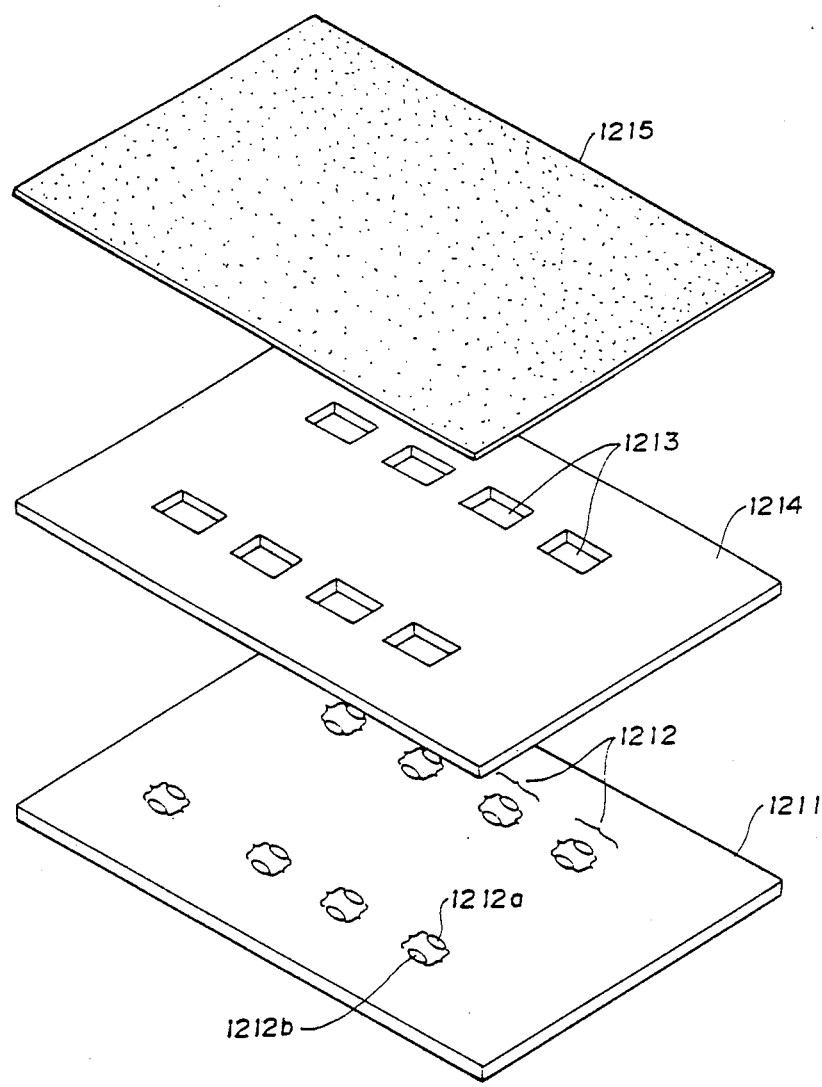
FIG. 5 is an exploded perspective view showing the internal structure of the display surface of the light emitting element module.

FIG. 5 is an exploded perspective view showing the internal structure of the display surface of the light emitting element module 12. In the illustrated embodiment, the circuit board 1211 consists of a printed circuit board, a ceramic board or the like, and eight light emitting diode pairs 1212 are fixedly secured over this circuit board 1211. Each of these light emitting diode pairs 1212 comprises a pair of light emitting diode chips 1212a and 1212b and are electrically connected in parallel to each other in directionally opposite and forms an array with the rest of the diode pairs.

Figure 6:
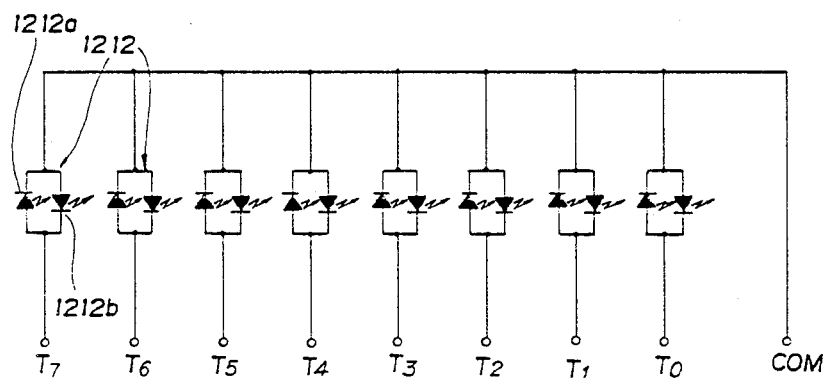
FIG. 6 shows the internal connection of the light emitting diode pairs.
Figure 7:
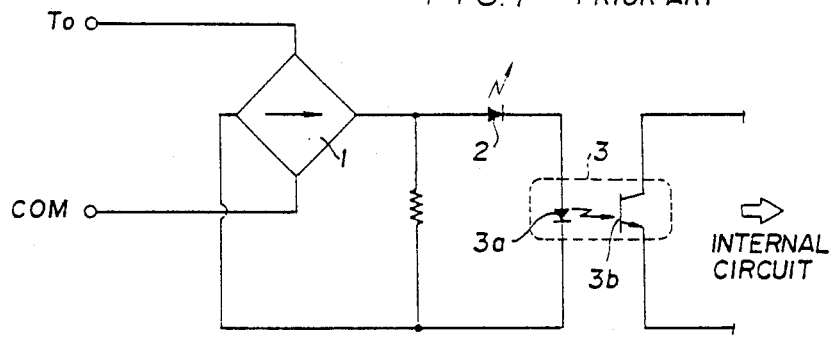
FIG. 7 is a circuit diagram showing an example of conventional input circuit.
Figure 8:
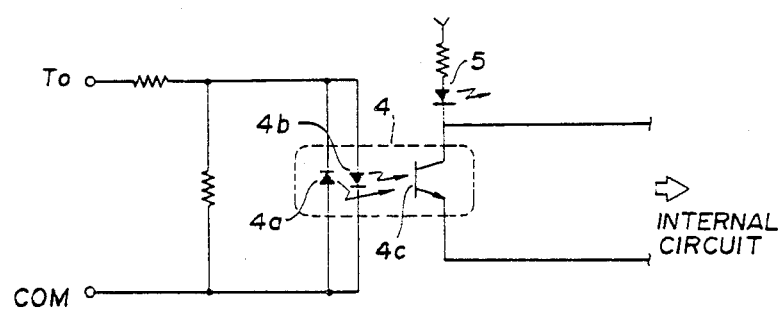
FIG. 8 is a circuit diagram showing another example of conventional input circuit.
Figure 9:
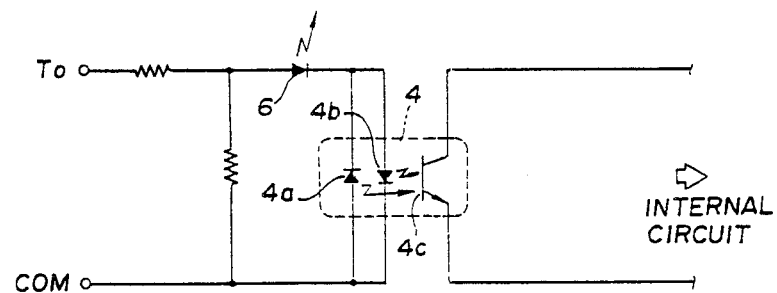
FIG. 9 is a circuit diagram showing a proposed hypothetical improvement of the conventional input circuits.

One end of each light emitting diode pair is connected to the corresponding one of the terminals T0 to T7 while the other end thereof is commonly connected to a common terminal COM as shown in FIG. 6. A spacer plate 1214 having a plurality of windows 1213 adjacent to the mounted positions of the light emitting diode pairs 1212 is layered over the circuit board 1211 and a light dispersing film 1215 is layered thereover.

Therefore, each of the windows 1213 will be wholly lighted up as shown in FIG. 3 when either one of the light emitting diode chips is lighted up.

Thus, by mounting this light emitting element module 12 on the circuit board 13 of the input circuit and connecting the terminal pins 1201 to 1209 as shown in FIG. 1, the presence of an input signal at each input point can be directly seen from the front face of the circuit board 13 of the input circuit.

In the above described embodiment, the output element of the bi-directional input type photo-coupler consisted of a transistor, but if the internal circuit is driven by an AC power source the output element may then be a triac.

Also, the bi-directional input type photo-coupler 11 is not limited by the present embodiment but may be other light emitting elements which are conductive in two directions.

Although the present invention has been shown and described with reference to the preferred embodiment thereof, it should not be considered as limited thereby. Various possible modifications and alterations could be conceived of by one skilled in the art with respect to any particular embodiment without departing from the scope of the invention.

What I claim is:

1. An input circuit for accepting an external input signal by way of a photo-coupler for circuit isolation, comprising:
   a photo-coupler having an input end comprising a bi-directional element; and
   an indicator of a bi-directional type which is connected in series with the input end of the photo-coupler and comprises a pair of light emitting diode chips.

2. An input circuit as defined in claim 1, wherein the pair of chips are connected in parallel to each other but directionally opposite.

3. An input circuit as defined in claim 2, wherein the indicator comprises a circuit board carrying a plurality of pairs of said light emitting diode chips, a spacer plate having a plurality of windows corresponding to the positions of the light emitting diode pairs, and a light dispersing film which is placed over the spacer plate.

4. An input circuit as defined in claim 3, wherein the chips are placed adjacent to each other and the indicator further comprises a light dispersing element which covers the pair of chips.

5. An input circuit as defined in claim 1, wherein the chips which are connected in parallel to each other but directionally opposite and formed into an integral single device.

6. An input circuit as defined in claims 1 to 5, wherein the input end of the photo-coupler comprises a pair of light emitting diodes which are connected in parallel with each other but directionally opposite.

7. An input circuit as defined in claim 2, wherein the input end of the photo-coupler comprises a pair of light emitting diodes which are connected in parallel with each other but directionally opposite.

8. An input circuit as defined in claim 3, wherein the input end of the photo-coupler comprises a pair of light emitting diodes which are connected in parallel with each other but directionally opposite.

9. An input circuit as defined in claim 4, wherein the input end of the photo-coupler comprises a pair of light emitting diodes which are connected in parallel with each other but directionally opposite.

10. An input circuit as defined in claim 5, wherein the input end of the photo-coupler comprises a pair of light emitting diodes which are connected in parallel with each other but directionally opposite.

* * * * *